US006774639B1

(12) United States Patent
Unsworth (10) Patent No.: US 6,774,639 B1
(45) Date of Patent: Aug. 10, 2004

(54) PARTIAL DISCHARGE MONITORING SYSTEM FOR TRANSFORMERS

(75) Inventor: Joseph Unsworth, New South Wales (AU)

(73) Assignees: TransGrid, New South Wales (AU); University of Technology, Syndey, New South Wales (AU)

(*) Notice: Subject to any disclaimer, the term of this patent is extended or adjusted under 35 U.S.C. 154(b) by 0 days.

(21) Appl. No.: 10/070,251

(22) PCT Filed: Aug. 30, 2000

(86) PCT No.: PCT/AU00/01028

§ 371 (c)(1),
(2), (4) Date: Jul. 10, 2002

(87) PCT Pub. No.: WO01/18554

PCT Pub. Date: Mar. 15, 2001

(30) Foreign Application Priority Data

Sep. 2, 1999 (AU) .............................................. PQ2605

(51) Int. Cl.[7] .............................................. G01R 31/06
(52) U.S. Cl. ..................... 324/547; 324/535; 324/536
(58) Field of Search ................................ 324/547, 532, 324/535, 536; 73/587, 590, 602, 642

(56) References Cited

U.S. PATENT DOCUMENTS

| | | | | |
|---|---|---|---|---|
| 5,233,305 A | * | 8/1993 | Nishizawa et al. ......... | 324/547 |
| 5,386,193 A | * | 1/1995 | Maeda et al. ............... | 324/547 |
| 5,530,366 A | * | 6/1996 | Nasrallah ..................... | 324/547 |
| 6,323,655 B1 | * | 11/2001 | Fu et al. ...................... | 324/536 |
| 6,340,890 B1 | * | 1/2002 | Bengtsson et al. .......... | 324/536 |
| 6,420,879 B2 | * | 7/2002 | Cooke ......................... | 324/536 |
| 6,445,189 B1 | * | 9/2002 | Pakonen et al. ............ | 324/536 |
| 6,446,027 B1 | * | 9/2002 | O'Keeffe et al. ........... | 702/183 |

FOREIGN PATENT DOCUMENTS

DE    WO 94/28566 A1    12/1994

* cited by examiner

*Primary Examiner*—Andrew H. Hirshfeld
*Assistant Examiner*—Minh Chau
(74) *Attorney, Agent, or Firm*—Ladas & Parry (57) ABSTRACT

An apparatus for detecting partial discharge in on-line high voltage electrical equipment containing a dielectric, such as high voltage transformers. The apparatus includes an ultrasonic transducer and an annular capacitive plate for detecting, respectively, the ultrasonic pulse and the radio frequency pulse generated by the occurrence of partial discharge in the equipment. The outputs of the transducers are analyzed by signal processing means to allow determination of occurrences of true partial discharge from the plethora of electrical noise normally present in on-line voltage equipment

28 Claims, 6 Drawing Sheets

PARTIAL DISCHARGE MONITORING SYSTEM FOR TRANSFORMERS

TECHNICAL FIELD

The present invention relates generally to a system for monitoring the performance of electrical equipment, such as high voltage transformers. In particular, the system can detect the occurrence of faults in the overall insulation of such transformers and provide signals that trigger local and/or remote alarms indicative of the faults.

BACKGROUND ART

High voltage generator and transmission transformers form an integral part of any electrical power generation distribution and transmission system. Other transformers, such as rectifier transformers are, also used in industrial processes, such as smelting electro-deposition processes. Also, current transformers (CTs) are used for protection and metering of electricity distribution systems.

The most important part of the insulation for oil filled transformers comprises paper which is wound around the copper windings. There are spacers, washers, seals, lead through plates, taps and bushings, which are also part of the insulation system within the transformer. In order to enhance the insulation and stability, the paper is permeated with a dielectric, typically mineral oil or silicone oil, which fills the transformer. This insulating oil also serves as a coolant, distributing heat by convection or forced flow, and also quenches discharges. Other types of transformers include high frequency communication transformers which use solid polymeric dielectrics such as epoxy thermoset, which is vacuum back-filled into the transformer, and gas-filled transformers. Gas-filled transformers, for example those used in underground mines, are usually filled with argon or sulfur hexafluoride for safety. There are also some low voltage air filled transformers.

The operating lifetime of a high voltage transformer can be greater than 35 years. The lifetime depends on the loading, design, quality of manufacture, and materials and maintenance routines. During its lifetime, the transformer insulation can degrade, the rate of degradation being dependent upon the workload and the internal operating environment of the transformer, such as temperature, moisture content, pH and the like. Any degradation of the insulation, such as electronic and ionic plasma erosion of solid insulation surrounding an air bubble occluded due to faulty manufacture, can result in increasing levels of partial discharge within the transformer. Occurrence of partial discharges also leads to evolution of gases such as hydrogen and acetylene within the transformer. Such increased partial discharge leads to further degradation of the insulation which in turn leads to increasable levels of partial discharge. Continued degradation of the insulation can result in severe discharges, short-circuit faults or a catastrophic failure due to an explosion of the gases, for example, hydrogen, acetylene and ethylene, produced as chemical by-products of the degradation process. Such failure can result in reduction or loss of supply to the power system, incur considerable expense for the replacement or repair of the transformer and also present a serious risk to nearby personnel and the environment.

Partial discharge in transformers can also occur due to faulty manufacture and/or mechanical or electrical fatigue. For example, the movement of loose components, and creep and stress relaxation of metallic components, such as fastenings, or foreign metallic bodies within the transformer, provide an opportunity for discharges to occur even when there has been no or little degradation of the insulation.

Partial discharge in transformers can also arise due to windings becoming loose within the transformer. Wear and tear suffered by the tap connectors in the tap changer can also cause partial discharges. Faults in the bushings can also result in partial discharges.

It is known that a partial discharge can produce signals at different locations within a large transformer including a discharge current in neutral caused by imbalance, a displacement current through the capacitive tapping of a bushing, a radiated radio frequency (RF) pulse or wave and a radiated ultrasonic (US) pulse or wave.

The magnitude of partial discharge within a transformer provides one means of determining the integrity of the transformer's insulation. For example, a detected partial discharge having a magnitude of 50 pC would normally be ignored at normal voltage operations, a reading of 500 pC would be viewed with some concern, whilst a reading of 5000 pC would be considered potentially dangerous.

Power authorities typically test transformers by sampling the mineral oil within the transformer about once a year to determine the oil's dissolved gas concentration by analysis (DGA) and dielectric loss angle (DLA). If high gas readings are obtained, the frequency of sampling is increased to monthly and even weekly. However, there is always some delay between the sampling and the analysis in the laboratory. Rapid deterioration of insulation may not be detected and transformers have failed catastrophically even when DGA sampling has been carried out. Since it is known that partial discharges of a higher magnitude and/or repetition rate develop shortly before a major failure, continuous monitoring of electrical equipment, while it is kept on-line, to provide early warning, is very desirable.

Partial discharge can be measured using instruments such as Robinson, Haefly or Tettex partial discharge detectors, which detect high frequency electrical (RF) signals only, by coupling to the lower part of the bushing on the transformer or to the windings using capacitor dividers and a toroid system. These instruments are normally used in a test bay during high voltage proving tests for a new or re-wound transformer. These measurements can, however, normally not be undertaken in a substation location due to the high level of electrical interference. Making reliable readings with these instruments also requires considerable skill.

One device for detecting the occurrence of a single partial discharge event in a transformer is described in International Application No PCT/AU94/00263 (WO 94/28566). This device comprised an ultrasonic transducer and a radio frequency antenna that were mounted in the transformer wall and adapted respectively to detect the ultrasonic and radio frequency pulses generated by a partial discharge. If a radio frequency signal was detected within a pre-set time period before detection of an ultrasonic signal, a partial discharge was assumed to have occurred. While able to detect such signals, one problem with the device described in WO 94/28566 was that electrical noise within the transformer would generate randomly occurring radio signals that lead to the triggering of false alarms on occurrences of partial discharge. Shutting down a transformer based on a false alarm is clearly undesirable and costly.

DISCLOSURE OF THE INVENTION

According to a first aspect, the present invention is an apparatus for detecting partial discharge in on-line high voltage electrical equipment containing a dielectric, each partial discharge generating a radio frequency pulse or wave and an ultrasonic pulse or wave, the apparatus comprising:

at least one transducer means for detecting the ultrasonic pulse or wave generated by the occurrence of a partial discharge and subsequently outputting a signal corresponding to this detection:

at least one transducer means for detecting the radio frequency pulse or wave generated by the occurrence of a partial discharge and other radio frequency pulses or waves generated within the equipment and subsequently outputting a signal corresponding to this detection; and a signal processing and analysing means which receives the signals corresponding to the detection of the radio frequency pulse or wave and ultrasonic pulse or wave and which, on receiving a signal corresponding to detection of an ultrasonic pulse or wave, is adapted to:

(a) determine, within a pre-set time period preceding the instance of time of detection of the ultrasonic pulse or wave, the time delay between the instance of detection of all detected radio frequency pulses or waves and the instance of time of detection of said ultrasonic pulse or wave and generate a spread of time delay values over the pre-set time period:

(b) superimpose the spread of time delay values against other spreads of time delay values of a plurality of other detected ultrasonic pulses or waves: and (c) analyse the superimposed spreads of time delay values to determine if a proportion of the detected ultrasonic pulses or waves are being detected at one or more particular time delay values after the time of detection of the detected radio frequency pulses or waves.

According to a second aspect, the present invention is a process for detecting partial discharge in on-line electrical equipment containing a dielectric, each partial discharge generating a radio frequency pulse or wave and an ultrasonic pulse or wave, the process comprising the steps:

(i) detecting radio frequency pulses or waves generated within the equipment:

(ii) detecting ultrasonic pulses or waves generated within the equipment:

(iii) on detection of an ultrasonic pulse or wave, determining within a pre-set time period preceding the instance of time of detection of the ultrasonic pulse or wave, the time delay between the instance of detection of all detected radio frequency pulses or waves and the instance of detection of said ultrasonic pulse or wave and generate a spread of time delay values over the pre-set time period:

(iv) superimposing the spread of time delay values against other spreads of time delay values of a plurality of other detected ultrasonic pulses or waves; and (v) analysing the superimposed spreads of time delay values to determine if a proportion of the detected ultrasonic pulses or waves are being detected at one or more particular time delay values after the time of detection of the detected radio frequency pulses or waves.

In the above aspects, the superimposing of the spreads of time delay values of a plurality of detected ultrasonic pulses leads to the constructive addition of any identical time delay values from each of the spreads in a histogram of counts of time delay values over the pre-set time period. This constructive addition at one or more particular time delay values readily distinguishes this particular time delay value from those determined time delay values that are simply a result of asynchronous electrical noise within and around the electrical equipment.

The electrical equipment monitored by the apparatus and process in the above aspects preferably comprises power, instrument, current and high frequency transformers containing a dielectric, the dielectric being a mineral or silicone oil, epoxy or gas. Hereinafter, for the purposes of clarity, operation of the present invention will be described in relation to its application to monitoring partial discharge in high voltage transformers. By on-line, it is to be understood that the present invention can monitor the transformers when the transformers are being operated or in use. This might include when the transformer is being operated under normal operating conditions, but can also include situations where the transformer is being operated in abnormal conditions or being operated for the purpose of its testing, for example, during approval tests when overvoltages or impulses are applied, or the testing of a system that the transformer is a part.

In a preferred embodiment of each aspect, any radio frequency pulses generated within the transformer can be continuously monitored. Similarly, any ultrasonic pulses generated within the transformer can be continuously monitored. As such, it will be understood that in normal operation the monitoring of ultrasonic and radio frequency pulses will be done concurrently. Furthermore, in a preferred embodiment the monitoring of ultrasonic and radio frequency pulses will continue even when the analysing means is analysing received signals.

In a preferred embodiment, the pre-set time period preceding the time of detection of the ultrasonic wave is set to be greater than the maximum possible time delay that could exist between a detected radio frequency pulse and a detected ultrasonic pulse. In one embodiment, the time period can be set at the time of installation of the apparatus in the transformer. In another embodiment, the time period can be adjustable following installation of the apparatus. In a typical transformer, the pre-set time period might be set between 1 ms and 10 ms, more preferably between 2 ms and 6 ms and still more preferably at or about 4 ms. This pre-set time period is determined by the data storage capabilities of the apparatus and should take into account the largest internal dimension of the transformer (normally the diagonal distance from corner to corner), and the speeds of ultrasonic pulses in the materials that comprise the internal parts of the transformer such as the dielectric, laminated iron core, copper windings and the like.

In the case where the pre-set time prior to the ultrasonic pulse is set at 4 milliseconds and the apparatus is sampling in 60 microsecond blocks, it will be appreciated that there are a maximum of 66 sample time delay periods that can constitute the spread of time delay values combined in the histogram.

In superimposing a plurality of spreads of time delay values, the signal processing software and analysing means can superimpose all spreads generated within a particular time period. The time period can range from a few milliseconds to minutes and even hours, if desired. In one embodiment, the analysing means can superimpose all spreads generated in a particular time period just preceding the step of superimposing the spreads. The time period can be between 0.1 and 10 seconds, more preferably 1 and 8 seconds, and even more preferably be about 2 seconds. The analysing means can be adapted to continuously update the superimposition of the spreads of generated time delay values, so discarding, those spreads generated earlier than the particular time period. For example, the superimposition at any particular time will only include those spreads of time delay values generated in the particular time period preceding this time. In one embodiment, the particular time period can be pre-set at the time of installation of the apparatus in a transformer. In another embodiment, the time period can be adjustable following installation of the apparatus.

In a preferred embodiment, the analysing means comprises a microprocessor means under the control of appropriate software instructions. The microprocessor means can be physically located close to the transformer or can be located at a distant location.

The software instructions of the microprocessor can be adapted to statistically count the number of determined time delay values within a spread of time delay values and superimpose these counts with the counts made from a plurality of such spreads generated on detection of other ultrasonic pulses within the particular pre-set time period to form a histogram of counts versus time delay value. Since the time delay value for a particular partial discharge location does not vary, a peak develops in the histogram corresponding to the time delay value between the radio frequency pulse and ultrasonic pulse being generated by the partial discharge. If there are two sites of partial discharge within the transformer, two peaks would be generated in the histogram so long as the distance between each site and the transducer was different. As, in operation, the analysing means is required to superimpose a plurality of spreads of time delay values, it will be appreciated that the analysing means has a means of processing such a plurality of spreads at least for a time sufficient to allow formation of the histogram of counts versus time delay value. However, if the time delay is the same for one head it will be different for another head. Typically, two, three or four heads can be installed depending on the type, size, design and power rating of the transformer to address this issue.

In a preferred embodiment, the ultrasonic transducer means of detection of an ultrasonic pulse also outputs a signal representative of the amplitude of the detected ultrasonic pulse. In this embodiment, the analysing means is preferably adapted to receive this amplitude signal. The analysing means can be adapted to disregard spurious signals representative of ultrasonic pulses less than a pre-determined amplitude setting. In one embodiment, the analysing means can be adapted to undertake no further analysis of the ultrasonic signal if the amplitude of the ultrasonic pulse that lead to the generation of that signal is below a pre-determined amplitude setting. The pre-determined amplitude setting can be pre-set at the time of installation of the apparatus in the transformer. In another embodiment, the pre-determined amplitude setting can be adjustable following installation of the apparatus. It will also be appreciated that some ultrasonic pulses may be generated that are below the detection threshold of the ultrasonic transducer.

In another embodiment, the radio frequency transducer means of detection of a radio frequency pulse also outputs a signal representative of the amplitude of the detected radio frequency pulse. In this embodiment, the analysing means is preferably adapted to receive this amplitude signal. The analysing means can be adapted to disregard signals representative of radio frequency pulses less than a pre-determined amplitude setting. The predetermined amplitude setting for radio frequency pulses can be pre-set at the time of installation of the apparatus in the transformer. In another embodiment, the pre-determined amplitude setting can be adjustable following installation of the apparatus. It will also be appreciated that some radio frequency pulses may be generated in the transformer that are below the detection threshold of the radio frequency transducer.

In one embodiment, the analysing means can be adapted to activate an alarm means if the results of an analysis of the received signals over a period meets criteria considered indicative of partial discharge. The criteria considered indicative of partial discharge can be pre-set at the time of installation of the apparatus in the transformer. In another embodiment, the criteria can be adjusted following installation.

In one embodiment, the analysing means can be adapted to activate varying types of alarm means depending on the nature of the detected ultrasonic pulse. For example, the analysing means, on receiving an ultrasonic signal and determining that there is a peak in counts at one or more particular time delay values between detection of the radio frequency and ultrasonic pulses, can determine if the ultrasonic pulse has a magnitude greater than the pre-determined amplitude setting. If the amplitude is greater than the pre-determined amplitude setting and/or there is considerable repetition of generation of ultrasonic pulses above some pre-determined setting, the signal processing software analysing means can activate a specific type of alarm means. For example, this set of conditions may be said to activate a Class 1 alarm. If a peak at a time delay value has been determined but the amplitude and/or repetition of generation of the ultrasonic pulses is below the pre-determined setting, then this set of conditions may be said to activate a Class 2 alarm.

If the analysing means receives signals representative of ultrasonic pulses that are greater than the pre-determined amplitude and/or repetition setting but does not determine that there is any peak at any time delay value between the signals and any preceding radio frequency signals, this set of conditions may be said to activate a Class 3 alarm. Finally, if ultrasonic pulses are detected that are less than the pre-determined amplitude and/or repetition setting but again without any determination of a peak at any time delay value, this set of conditions may be said to activate a Class 4 alarm. In still a further embodiment, the pre-determined amplitude and/or repetition setting in the analysing means can be different in the case where there has been no determination of a peak at any time delay value to that when there has been a determination of a peak at some time delay value. For example, if a peak in counts at a time delay value is determined, the pre-determined setting might be set lower than the setting in the case where no peak at a time delay value between a detected ultrasonic pulse and radio frequency pulse has been determined.

By activating different classes of alarms, the analysing means provides an organisation monitoring the performance of a transformer (for example, a power generation or distribution authority) the ability to determine the severity of the fault in the transformer. For example, activation of a Class 4 alarm might not be considered a significant cause of concern but may warrant that this transformer should be more closely monitored or undergo routine testing and maintenance at an earlier date than had otherwise been planned. In contrast, activation of a Class 1 alarm might be considered by the monitoring organisation as worthy of immediate or relatively quick shutdown of the transformer to allow on-site testing and, if necessary, repair of the fault either on-site or in a repair shop. If over a period of minutes, hours, days or even weeks, the apparatus activates firstly a Class 4 alarm, followed by a Class 3, or Class 2 and then a Class 1 alarm, this provides the monitoring organisation with an indication of the rate of increase of severity of the fault in the transformer and gives an indication of when the transformer should undergo inspection. Rapid change from activation of a Class 4 alarm to a Class 3 alarm or a Class 2 alarm to a Class 1 alarm would be considered very dangerous, for example, and normally lead to the transformer being taken off-line and shutdown.

The alarm means can comprise both visual and/or audible means. The visual alarm means can comprise bright flashing coloured lights, light emitting diodes (LEDs), or similar devices and may be integrated into pre-existing software monitoring systems such as SCADA. Harley, Citect, etc. It will be appreciated that an alarm condition might be indicated by the turning on of a light or the extinguishment of a light. In some instances, the latter is preferred as any failure of the light is readily noted and can be corrected. In an alternative embodiment, the alarm means might comprise an appropriate message on a television screen or computer monitor display. The audible alarm means might comprise a bell, buzzer, siren or other similar device. It has been found that a continuous 3 kHz sound from a tweeter is particularly effective. The alarm means can be physically located close to the monitored transformer or at some distant location.

In another embodiment, the analysing means can include a data storage means adapted to store all signals received from the respective transducer means, and/or the generated superimpositions of spreads of time delay values. The data storage means might be adapted to only store most recently logged data within a pre-set time period or only store data that is indicative of instances of partial discharge. For example, the storage means might only store all logged data from a preceding 24 hour period.

The stored data can be downloaded to a controlling means at a local or remote location either on request of an operator or automatically. In one embodiment, the controlling means or the analysing means might routinely initiate a data transfer from the analysing means on a particular day or at a particular time. For example, where a storage means is adapted to store data for 24 hours, the controlling means or analysing means might initiate a data transfer from the analysing means also about every 24 hours. Other time periods for data transfer can be readily envisaged.

If the controlling means notes that the microprocessor has initiated an alarm means, it can provide an appropriate indication to personnel responsible for monitoring the performance of the transformer. Such an appropriate indication might comprise a visual and/or audible indication on a computer monitor. The controlling means can also include appropriate data storage means to allow storage of all data transferred from the analysing means. The system allows archiving of the alarms and the data over periods of many months or even years. This data storage would allow responsible personnel in the monitoring organisation to compare monitored transformer performance against that monitored at some earlier time and so determine if there has been change in the performance, ie trend analysis. In a further embodiment, the controlling means would preferably be adapted to receive data transferred from a plurality of analysing means monitoring a number of different transformers. For example, the controlling means belonging to a power generation or distribution authority could be networked to all or some proportion of its transformers in the network that have the apparatus according to the present invention installed. This allows the power distribution authority to monitor the performance of the transformers in its network without the necessity to physically have maintenance personnel attend at the location of each transformer.

In one embodiment, the respective transducer means can be housed within a common enclosure. The enclosure can be positioned within the wall of the transformer such that one surface of each transducer means is coincident with the interior surface of the wall.

The transducer means for detection of ultrasonic pulses preferably comprises a piezoelectric element. The piezoelectric element preferably has a first face and a second face. The piezoelectric element preferably has a thickness resonant frequency between about 50 and about 300 kHz, more preferably 60 to 250 kHz, and most preferably at about 190 kHz. The piezoelectric element preferably has a maximum operating temperature of at least 100°C. and more preferably at least 120° C. The piezoelectric element preferably can also withstand mechanical vibrations at least up to 5 g.

The piezoelectric element is further preferably a ceramic/polymer composite. The piezoelectric element preferably has a 1–3 geometry. The ceramic can be selected from the group comprising poly-crystalline lead titanate, lead zirconate titanate (PZT), lead niobate or barium titanate. The polymer is preferably a thermosetting polymer. The thermosetting polymer can be selected from the group comprising epoxy resin, polyurethane, silicone or Bakelite.

The ceramic in the piezoelectric element can be fabricated by sintering and firing oxides or carbonates of barium, titanate, zirconate and/or lead to form a ceramic disc. The opposing parallel faces of the ceramic disc are then preferably coated with a suitable conductive material to form electrodes. The ceramic disc is then preferably poled by immersing the disc in hot oil and applying a DC electric field to the disc whilst it is held at a temperature of about 90° C. The oil is then preferably allowed to cool to room temperature whilst the electric field is maintained across the disc.

Once poled, the disc is mounted on an aluminium or epoxy block by adhering one face of the disc to the block using an epoxy adhesive. The block is then preferably carefully gripped in the chuck of a diamond saw cutting machine to avoid damage to the ceramic disc. The ceramic disc is then preferably sliced with a diamond edged saw to form a series of spaced parallel cuts. The disc is then preferably cleaned with methanol to remove any debris and then vacuum back filled with the thermosetting polymer, such as epoxy. Any excess epoxy is preferably removed by lapping before the disc is again preferably sliced by the cutting machine to form a further series of spaced parallel cuts that are at right angles to the first set of cuts. The disc is then cleaned with methanol before an outer casing of slightly greater diameter and height is preferably positioned around the disc before the disc and surrounding casing is vacuum back-filled with epoxy. The result is a set of parallel ceramic columns or pegs supported in the thermoset epoxy.

The outer casing provides extra support for the outer pegs in the composite and helps to prevent any inadvertent breakage of them, especially when the composite is subsequently sliced from the supporting block. The outer casing is also preferably formed from a thermosetting polymer, such as epoxy. The outer casing serves to further decrease the lateral sensitivity of the transducer to shear waves and lateral high frequency vibrations in the transformer wall that are unrelated to ultrasonic waves due to partial discharge. Once removed from the supporting block, the first and second surfaces of the composite are preferably lapped using 120, 400 and 600 grade emery paper, respectively, to expose the ceramic columns.

In a preferred embodiment, the first and second surfaces are coated with an electrically conductive adhesive, such as silver loaded epoxy. Following application and before setting of the silver loaded epoxy, electrically conductive gauze electrodes are pressed into and adhered with the silver loaded epoxy to form electrodes for the composite transducer. The electrically conductive gauze is preferably metallic gauze, and even more preferably can be brass gauze. On adhesion, the diameter of the metallic gauze is preferably greater than that of the first and second surfaces of the composite. Once applied, the gauze can be trimmed to the diameter of the first and second surfaces, respectively. In each case, a small tag of gauze is preferably retained to allow ready strong, reliable, ohmic electrical connection to the electrodes. Electrical connection to the tags is preferably provided by insulated copper wire that is soldered to each tag.

The composite transducer preferably has a short ring down time so that it recovers quickly from detection of an ultrasonic pulse and is ready to detect the next one. To increase the damping of the transducer, a backing plate can be cemented to the second surface of the transducer. The backing plate is preferably formed from a tungsten loaded epoxy.

A matching layer can also be attached to the first surface of the composite transducer. The matching layer can comprise one or more layers of the thermosetting polymer used in the composite. The thickness of this matching layer is preferably a quarter wavelength of the transducer thickness resonant frequency. The matching layer acts as an acoustic impedance converter between the higher acoustic impedance of the pegs and that of the oil thus improving the acoustic impedance matching of the composite overall. The acoustic impedance of the transducer is preferably as close as possible to the acoustic impedance of the oil so as to minimise the reflections of longitudinal ultrasonic waves at the first surface of the transducer. For maximum transfer, the matching layer is preferably the geometric mean of the composite and the oil. The matching layer also acts as a wear plate to protect the composite during use.

The composite transducer can have a tuning inductor electrically connected between the copper wires connected to the first and second surface electrodes to further enhance the sensitivity. The tuning inductor is preferably shielded to prevent magnetic pickup by the inductor in the transformer environment.

Once manufactured, each composite transducer is preferably tested using an impedance analyser to measure the electromechanical coupling of the transducer, the electromechanical coupling being a measure of the efficiency of the transducer in converting mechanical energy due to the ultrasonic waves into electrical energy.

In another embodiment for gas filled transformers, the ultrasonic transducer can be manufactured from a piezoelectric polymeric material. In one preferred embodiment, the piezoelectric polymeric material can be polyvinylidene fluoride (PVDF).

The transducer means for detection of radio frequency pulses can comprise an antenna selected from the group of a ferrite core aerial, a tuned circuit, or a capacitive metal plate. The capacitive metal plate is preferred and preferably has a capacitance to ground of between 20 pF and 250 pF. The plate preferably has an annular geometry and can be fabricated from brass. The area of the annular plate, the dielectric constant of the insulant in the transformer and the spacing of the annular plate and supporting adjustable spacers from the transformer wall (which is earthed and forms the other plate of the capacitor) determines the capacitance value.

Within the common enclosure, the piezoelectric element is preferably positioned coaxially within the capacitive annular plate and adapted such that the dielectric surrounds the capacitive plate and all but one face of the outer casing of the piezoelectric transducer. It is preferred that all air bubbles in the dielectric be removed by degassing prior to and after installation of the transducers. A bleed hole can be provided to ensure that the space about the transducers is completely filled with mineral oil.

Both the ultrasonic and radio frequency transducers can be electrically and mechanically attached to a lead through plate using thick copper wires and one or more bolts. Adjustable spacers around the bolts supporting the annular brass plate can allow the distance between the plate and the transformer wall to be set at a desired spacing thereby allowing for adjustment of the capacitance of the radio frequency transducer.

The lead through plate preferably consists of an epoxy moulded plate with brass insert threaded connectors. If a copper wire is attached at one side of the plate and a copper wire is attached at the other side of the epoxy plate, electrical continuity is provided through the epoxy plate from one side to the other. Typically, the lead through plate has several brass insert connectors. One of these brass insert connectors can be used to support the ultrasonic transducer using a bolt which is cast into the transducer, two insert connectors can be used to connect the thick copper wires from the ultrasonic transducer and three or more insert connectors can be used to support the brass annular plate being used as the radio frequency antenna.

The epoxy lead through plate, with the transducers attached, is located through a hole in the transformer wall or through an inspection cover so the transducers are inside the transformer. The lead through plate is then preferably sealed with neoprene O rings, or rubberised cork gaskets and held in position with metal flanges. Outside the transformer a metal enclosure is attached to the flanges.

Electrical connections using shielded coaxial cables are preferably made via the brass insert connectors in the epoxy lead through plate from the transducers to ultrasonic transducer circuitry and radio frequency transducer circuitry. This circuitry is preferably housed in a small metal box. This small box preferably fits into the larger metal enclosure attached to the flanges. Shielded twisted pair cables are then preferably connected from the outputs of the ultrasonic transducer circuitry and the radio frequency transducer circuitry in the metal box to insulated lead through connectors in the side of the metal enclosure. The lid of the enclosure, which preferably sits on a rubberised cork seal, is then preferably clamped in position so that the whole arrangement is waterproof and termite and vermin resistant.

The ultrasonic transducer processor that transmits the signals between the transducer and the analysing means preferably comprises in sequence an amplifier, a precision rectifier, a 125 kHz high pass filter, a 1 kHz low pass filter, an amplifier and a buffer with an analogue output. The radio frequency transducer processor that transmits the signals between the radio frequency transducer and the analysing means preferably comprises in sequence a 1 to 70 MHz pre-amplifier, a precision rectifier, a 1 MHz low pass filter, a high speed comparator and a monoshot with optically isolated digital output. All of the electronic components in the electronic processors are preferably capable of withstanding high temperature ie, military specification 120° C., because of the possible temperatures in the head enclosure on top of the transformer.

Where necessary, hereinafter, the transducers, epoxy lead through plate, connectors, shielded cables, seals, spacers, metal enclosure, ultrasonic transducer circuitry, radio frequency circuitry and lid are referred to collectively as the "head".

From the outputs of the ultrasonic and radio frequency transducer circuitry, electrical output signals are provided to the microprocessor of the analysing means via twisted pair shielded cable. The output of the microprocessor can be coupled by optical fibre cable to a computer having a coupled modem. The computer can be adapted to display alarm conditions on a computer monitor or can transmit the alarm conditions via the modem and a telephone or other communications network to the remotely located controlling means.

Normally, for most installations the system has to be able to withstand environmental temperatures in the range −25° C. to +120° C. However, with special components this range can be extended to −35°C. to +120° C. A special electronic cut-out device set at +110° C. can be incorporated to shutdown and protect the system. The possible working range is therefore −35°C. to +110° C., which is adequate for most installations.

In a further embodiment, the location in 3D of a partial discharge source within a high voltage transformer can be determined by analysis of the signal outputs from at least three transducer heads housed within the wall of the transformer. If a partial discharge is detected, the analyser means preferably determines the time delay values at each transducer head and then estimates the location of the partial discharge source by triangulation. It will be understood that the resolution of location can be improved by allowing for variation in the velocities of ultrasonic waves in the different materials in the transformer, allowing for refraction at interfaces and by iteration finding the most probable acoustic paths for the ultrasonic pulse from the partial discharge source to each of the three heads.

In a still further embodiment, following installation of an apparatus according to the present invention in a transformer, the apparatus can be tested and calibrated. Such testing and calibration can be undertaken by positioning a partial discharge generator in the transformer to simulate a fault in the transformer's insulation. By being able to vary the level of partial discharge injected into the transformer, it is possible to set the sensitivity levels of the apparatus. Once testing and calibration is complete, the partial discharge generator can be removed.

According to a further aspect, the present invention is a transducer unit comprising:
a piezoelectric composite disc for detecting ultrasonic pulses or waves and subsequently outputting a signal corresponding to this detection, the piezoelectric element having electrodes formed on a first surface and a second surface, the electrodes being formed of an electrically conductive metal gauze material pressed into an electrically conductive adhesive; and
an annular capacitive plate for detecting radio frequency pulses or waves and subsequently outputting an electrical signal corresponding to this detection.

In a preferred embodiment of this further aspect, the electrically conductive adhesive is a silver loaded epoxy coated on the first and second surfaces. The electrically conductive gauze is preferably a brass or copper gauze. The diameter of the metallic gauze is preferably greater than that of the first and second surfaces of the composite. Once applied, the gauze can be trimmed to the diameter of the first and second surfaces, respectively. In each case, a small tag of gauze is preferably retained to allow ready electrical connection to the electrodes. Electrical connection to the tags is preferably provided by insulated or enamelled copper wire that is soldered to each tag.

In other embodiments, the transducer unit can have the features as described above with respect to the first aspect of the invention.

BRIEF DESCRIPTION OF THE DRAWINGS

By way of example only, a preferred embodiment of the present invention will be described with reference to the accompanying drawings in which.

BEST MODE FOR CARRYING OUT THE INVENTION

The transducer head of an apparatus for the monitoring of partial discharge in on-line high voltage transformers is generally shown as 10 in the drawings.

Figure 1:
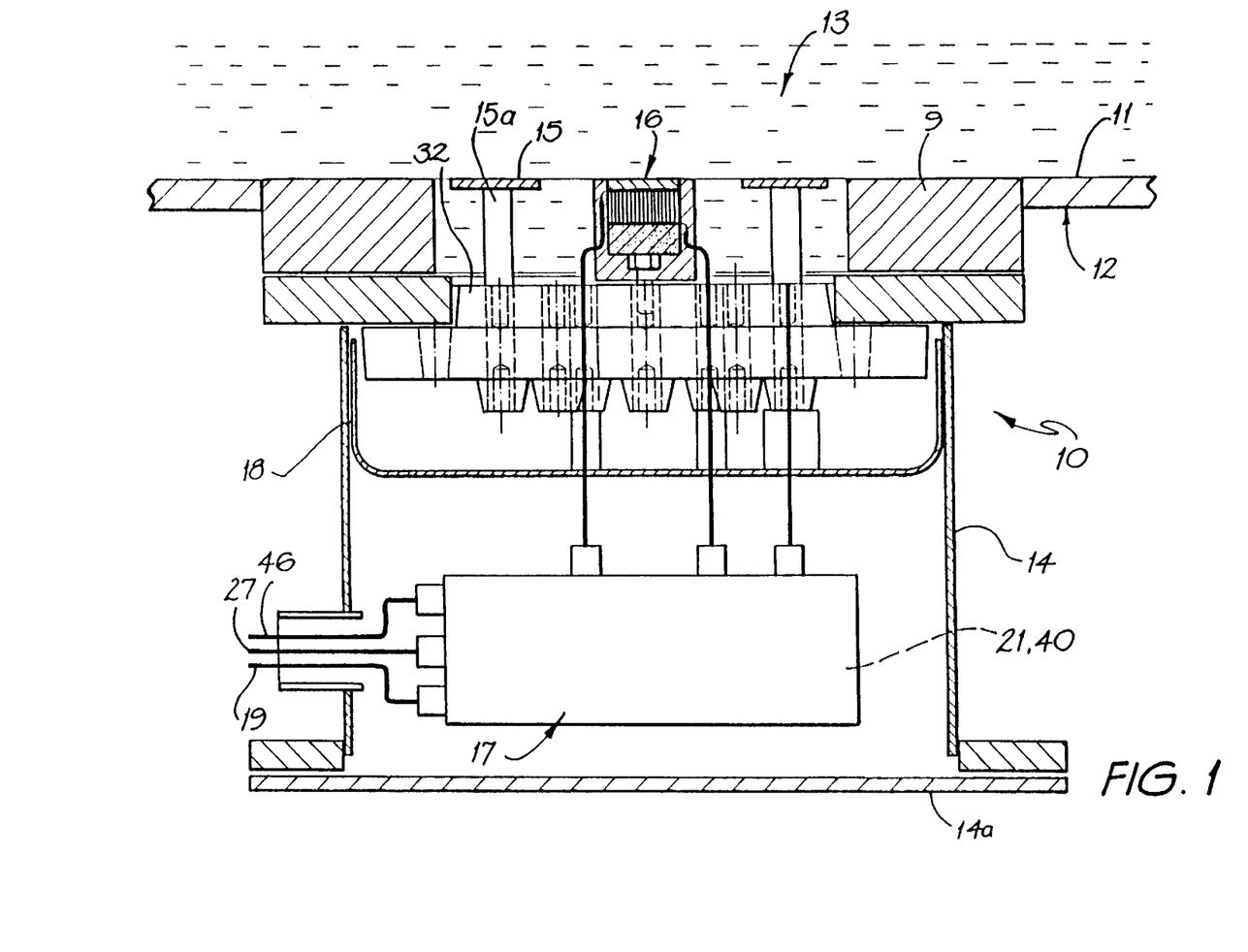
FIG. 1 is a partly cross-sectional view illustrating a transducer head of an apparatus according to the present invention positioned in the wall of a transformer.

As depicted in FIG. 1, the transducer head 10 is mounted within a wall 11 of a transformer 12 containing mineral oil 13. The transducer head 10 comprises a metal enclosure 14 having a metal lid 14a, inside which is an annular capacitive brass plate 15, for the detection of radio frequency pulses, and an ultrasonic transducer 16 acting as a detector of ultrasonic pulses. The plate 15 and transducer 16 are positioned so as to be coincident with the interior surface of the wall 11 of the transformer 12, although this is not critical.

Figure 2:
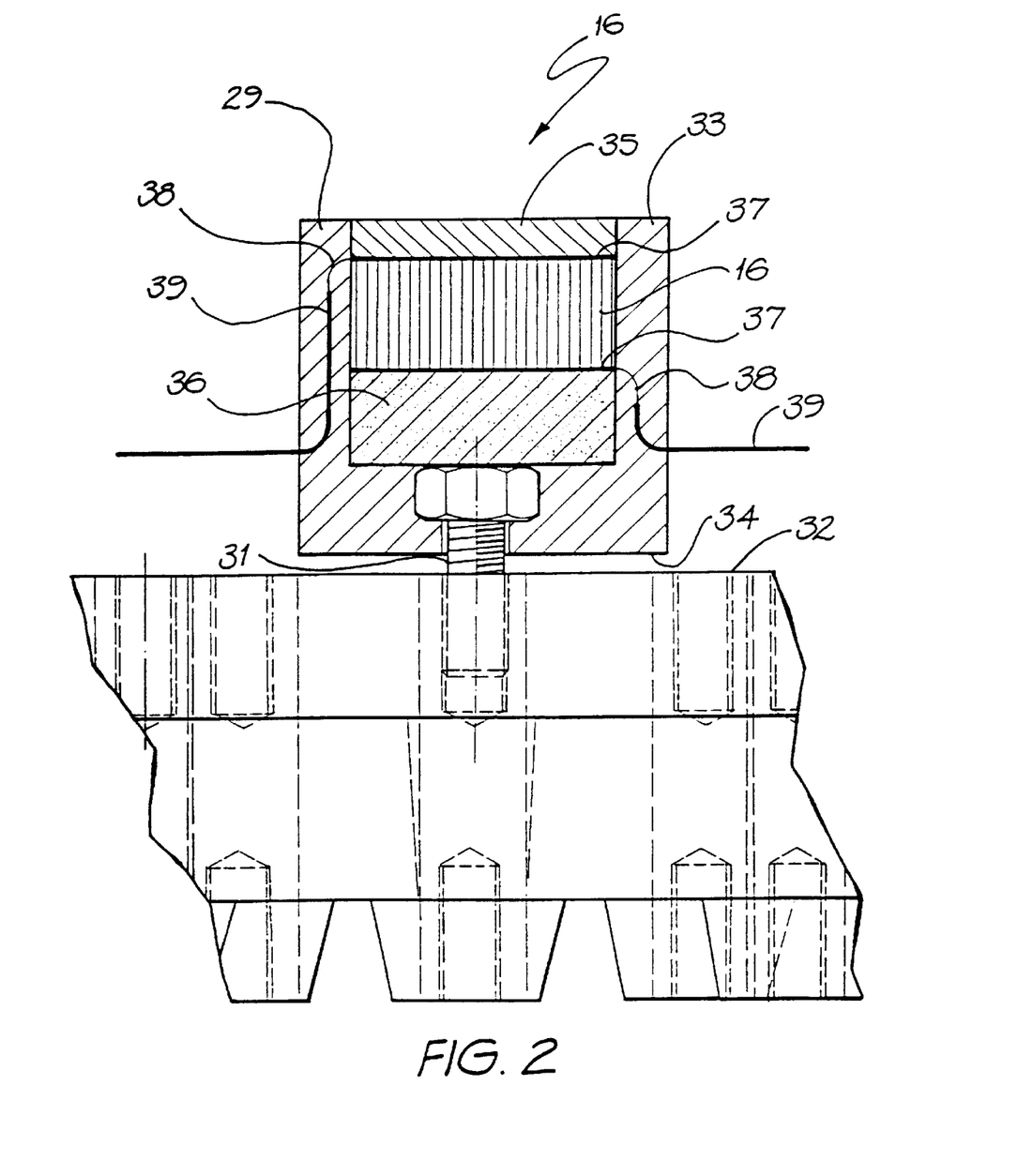
FIG. 2 is a cross-sectional view of the ultrasonic pulse detector within the transducer head.

As is depicted more clearly in FIG. 2, the ultrasonic transducer 16 is a ceramic/polymer composite having a 1–3 geometry, ie. the ceramic is aligned in 1 direction whilst the polymer has 3 directions. The ceramic within the transducer 16 is lead zirconate titanate (PZT), however, other suitable piezoelectric ceramic materials could be utilised. The polymer in the composite is a thermosetting epoxy resin. During fabrication, the ultrasonic transducer 16 is encapsulated within an epoxy casing 29. Once installed in the transducer head 10, the casing 29 is mounted by a mounting bolt 31 to a lead through plate 32. The casing 29 has a first face 33 and a second face 34.

Within the casing 29 and extending outwardly from the first face 33 is an epoxy matching layer 35. The matching layer 35 is impervious to the mineral oil 13 and has low acoustic impedance in mineral oil for ultrasonic pulses, thereby allowing detection with little reflection of an ultrasonic pulse from a partial discharge. The thickness of the matching layer 35 is a quarter wavelength at the transducer thickness resonant frequency. Extending outwardly from the second face 34 is a backing plate 36 that is formed from tungsten particle loaded epoxy resin that is substantially opaque to ultrasonic pulses. The tungsten loading of the epoxy in the backing plate 36 serves to ensure no reflection of ultrasonic signals is detected by the ultrasonic transducer 16 from the lead through plate 32 and also helps prevent ultrasonic pulses, propagating in the wall 11 of the transformer 12, being transmitted to the ultrasonic transducer 16.

Each face of the ultrasonic transducer 16 has an electrode 37 for the accumulation of charge. Each electrode 37 comprises a layer of silver loaded epoxy adhesive into which has been pressed a thin brass gauze sheet.

Electrical connection from each of the electrodes 37 is by way of tinned copper wire 38 and enamelled copper wire 39. While not depicted, a tuning indicator can be electrically connected between the copper wires.

The ultrasonic transducer 16 is positioned coaxially within the annular plate 15 such that the mineral oil 13 surrounds the plate 15 and all but one face of the casing 29. The annular plate 15 can have a capacitance to ground of between 20 and 250 pF and is made of brass.

The lead through plate 32, which is held in place by flanges 9, consists of an epoxy moulded plate with brass insert threaded connectors. Two brass insert connectors in the lead through plate 32 can be used as the electrical connection through the plate 32 from the copper wire 39 extending from the ultrasonic transducer 16 to coaxial cables extending to the ultrasonic transducer circuitry 40. Two or three adjustable brass insert threaded connectors 15a are used to support the annular plate 15 and also provide electrical connection for the electrical signals received by the plate 15 to travel through the plate 32 to the radio frequency signal processor 21 (see FIG. 3).

Figure 3:
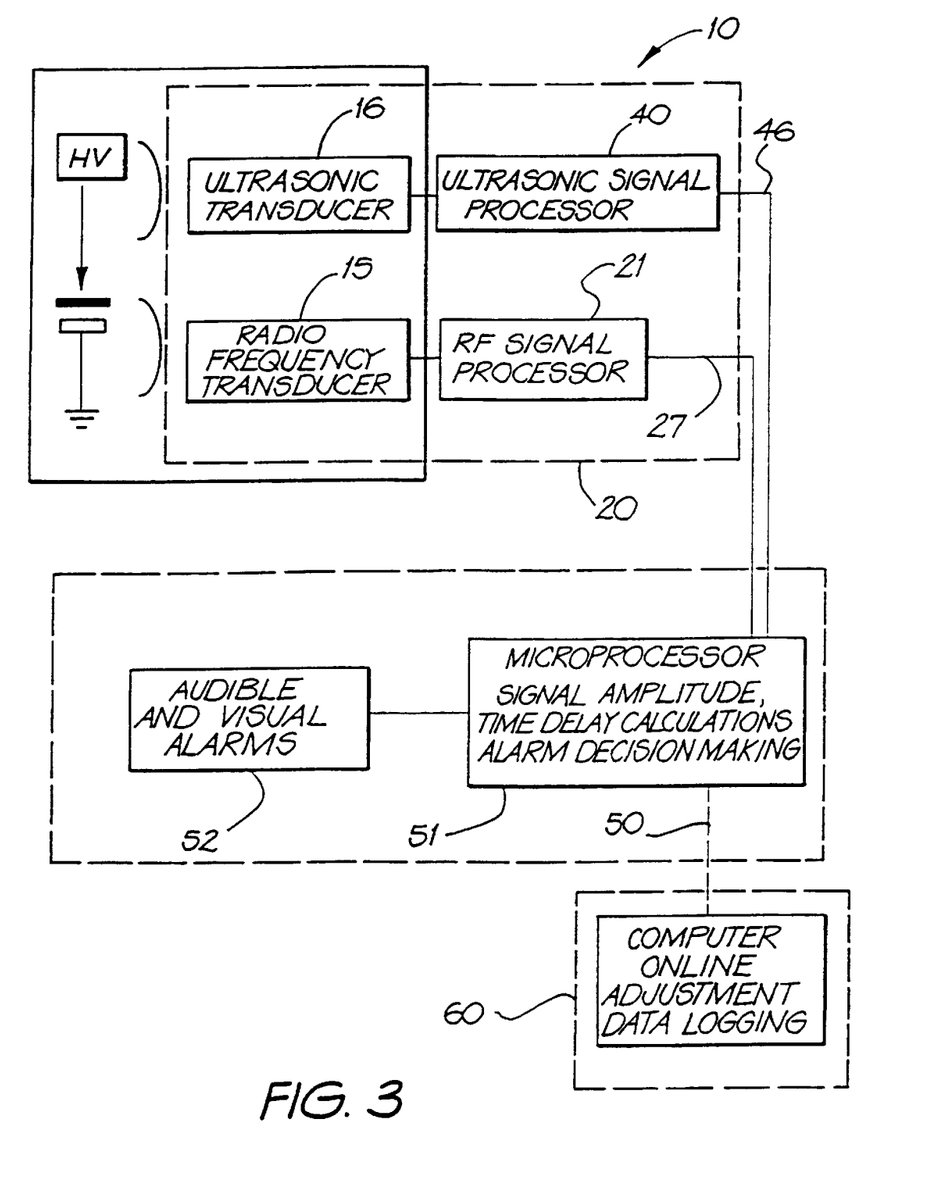
FIG. 3 is a schematic view of the apparatus according to the present invention.

The ultrasonic electronic circuit signal processor 40 and the radio frequency signal processor 21, are housed in a small metal box 17 within the enclosure 14 mounted to the external wall of the transformer 12. An electromagnetic noise shield 18 also surrounds the plate 32. Power for the processors 21, 40 is provided by a power supply (not depicted) that supplies power through cable 19 that enters the enclosure 14.

Figure 4:
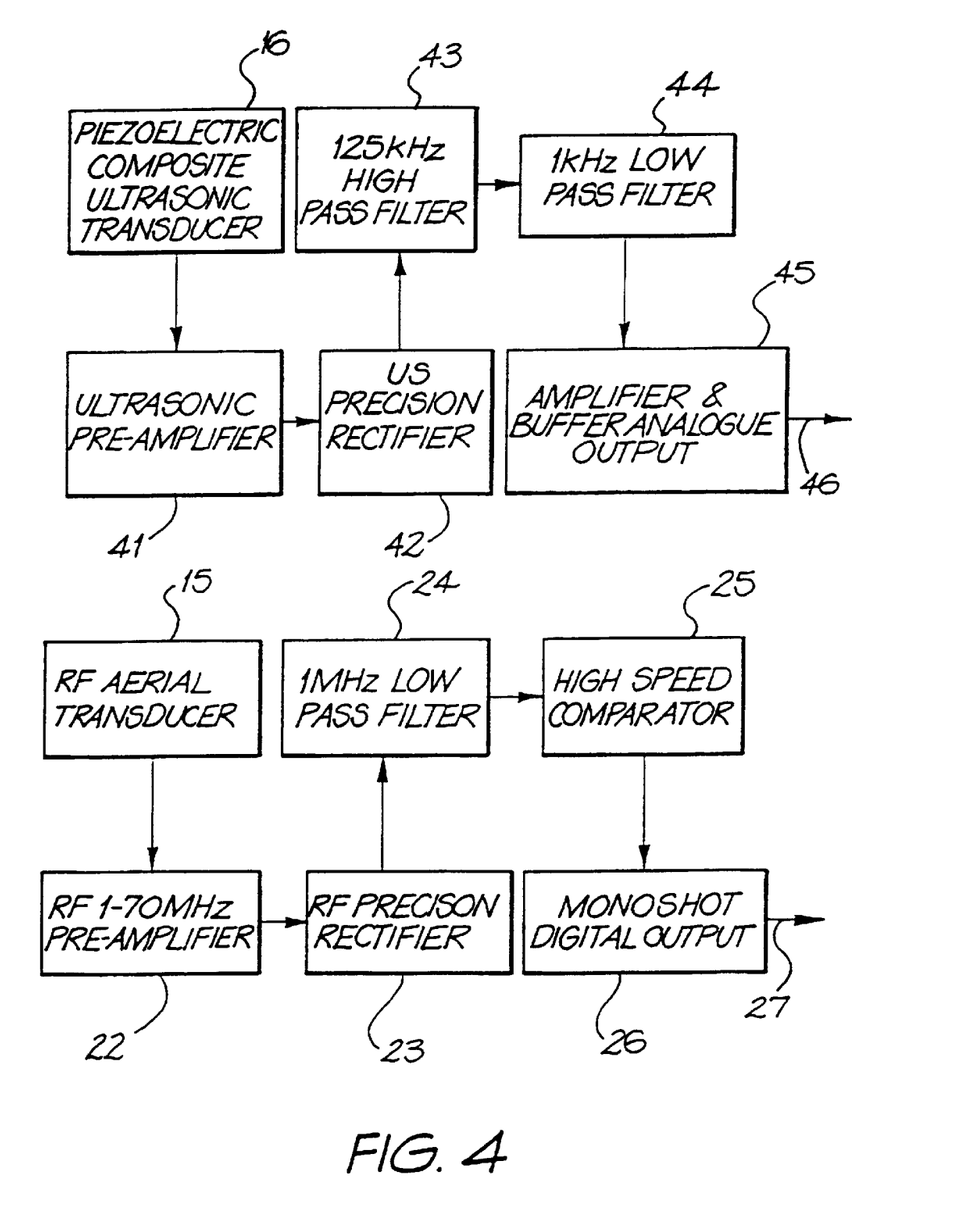
FIG. 4 is a schematic view of the ultrasonic signal and radio frequency signal processors in the apparatus depicted in FIG. 3.

As depicted in FIG. 4., the ultrasonic detector signal processor 40 that receives the signals from the ultrasonic transducer 16 and passes them to the analysing means 50 comprises in sequence a pre-amplifier 41, a precision rectifier 42, a 125 kHz high pass filter 43, a 1 kHz low pass filter 44, an amplifier and a buffer 45 having an analogue output 46.

The radio frequency signal processor 21 comprises in sequence a 1 to 70 MHz pre-amplifier 22, a precision rectifier 23, a 1 MHz low pass filter 24, a high speed comparator 25 and a monoshot 26 with digital output 27.

The amplified electrical signals from the radio frequency output 27 and ultrasonic output 46 of the transducer head 10 are transmitted via coaxial shielded cables to the analysing means 50.

The analysing means 50 comprises a microprocessor means 51 that processes the incoming signals under the control of appropriate software instructions.

Either at installation or following installation, the software of the microprocessor means 51 is calibrated. This calibration includes setting a value that will be the pre-set time period preceding the time of detection of an ultrasonic pulse. The pre-set time period would normally be set to be greater than the maximum possible time delay that could exist between a detected radio frequency pulse and a detected ultrasonic pulse given the dimensions of the transformer 12 in which the apparatus is being installed. In a normal case, the pre-set time period in the depicted microprocessor means 51 would be set at about 4 ms.

At the time of calibration, it would also be normal to set the particular time period from which the microprocessor means 51 will select and superimpose all spreads of time delay values measured between detected radio frequency and ultrasonic pulses. In a normal case, and for the purpose of the following description, the particular time period is set as the preceding 2 seconds.

At the time of calibration, it would also be normal to set the sensitivity of the apparatus. For example, the microprocessor means 51 may be set up to ignore signals transmitted from the ultrasonic transducer 16 and/or the radio frequency detector 15 that are below a particular amplitude and/or rate of repetition. During calibration, the pre-determined amplitude setting that establishes the class of alarm raised by the microprocessor means 51 can also be pre-set.

Figure 5:
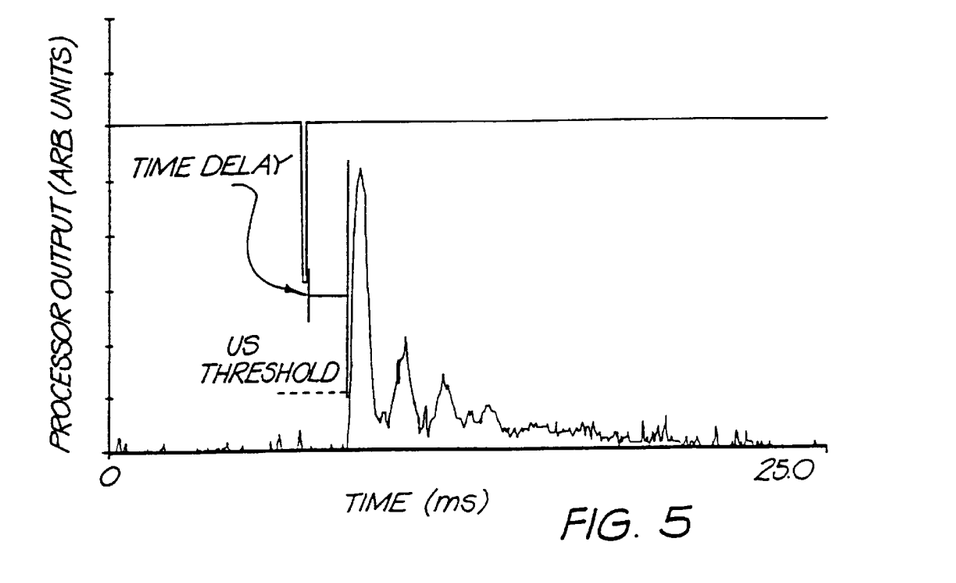
FIG. 5 is a graph depicting processor output versus time of one embodiment of microprocessor means in the apparatus according to the present invention following detection of a radio frequency signal and an ultrasonic signal.

In operation, the microprocessor means 51 on receiving a signal from circuitry 40 corresponding to an ultrasonic pulse, determines, within the preset time period of 4 ms, the time delay between the detection of any detected radio frequency pulses and the detection of the ultrasonic pulse and generates a spread of counts of time delay values over the 4 ms period. This spread of time delay values is then superimposed by the microprocessor means 51 with other determined spreads of time delay values generated in the preceding 2 seconds. The superimposition of the plurality of spreads is used to form a histogram as depicted as FIG. 6. Since the time delay value, as illustrated in FIG. 5, for a particular partial discharge location does not vary a peak develops in the histogram which distinguishes this time delay value from those other measured time delay values that were a product of asynchronous electrical noise within the transformer. While not depicted, if there were two sites of partial discharge within the transformer, it would be envisaged that two peaks would be generated in the histogram so long as the distance between each site and the transducer head was different.

Figure 7:
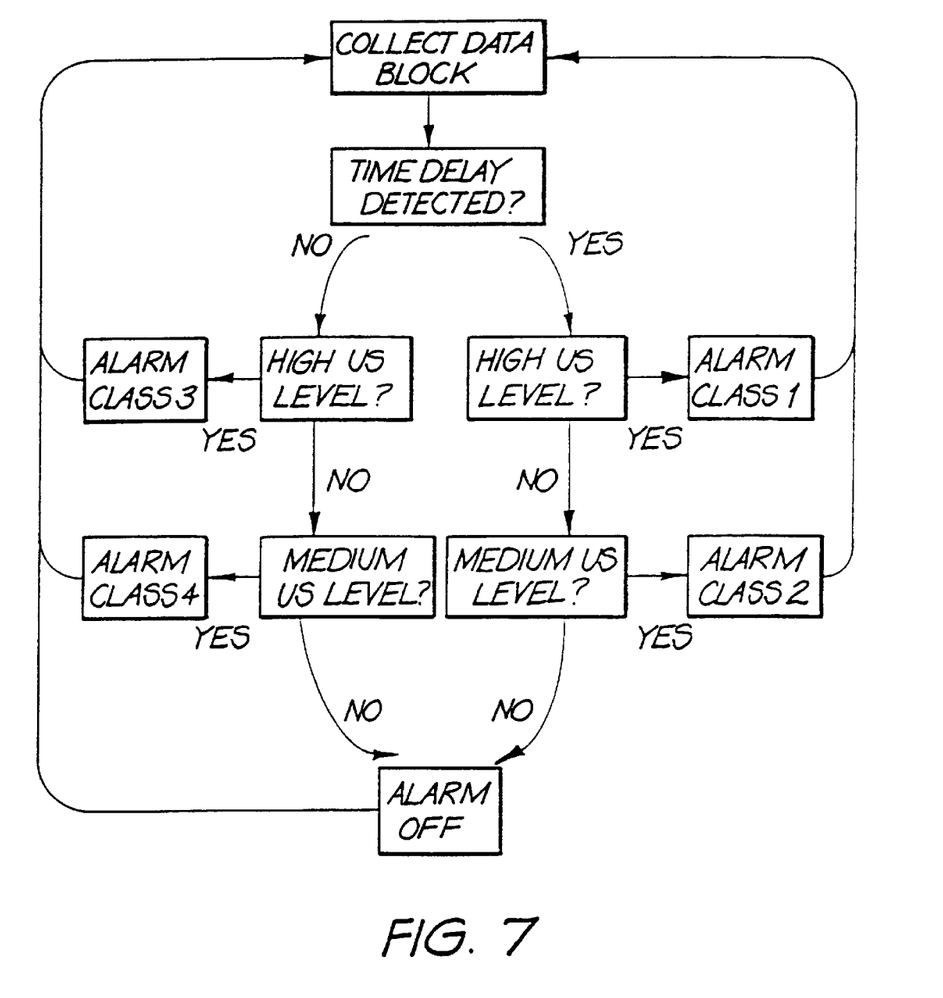
FIG. 7 is a flowchart for the generation of different alarm classes by the microprocessor means according to the present invention.

Once the microprocessor means 51 has determined that a time delay between detected radio frequency and ultrasonic pulses is present in the transformer, the characteristics of the detected ultrasonic pulse can be compared against pre-determined settings. As depicted in FIG. 7, if the amplitude and/or repetition of the ultrasonic pulses are greater than a pre-determined setting considered to represent a high ultrasonic level, the microprocessor means can activate a Class 1 alarm type. If the ultrasonic amplitude and/or repetition is not of a high level, the microprocessor means 51 can activate a Class 2 alarm type.

Figure 6:
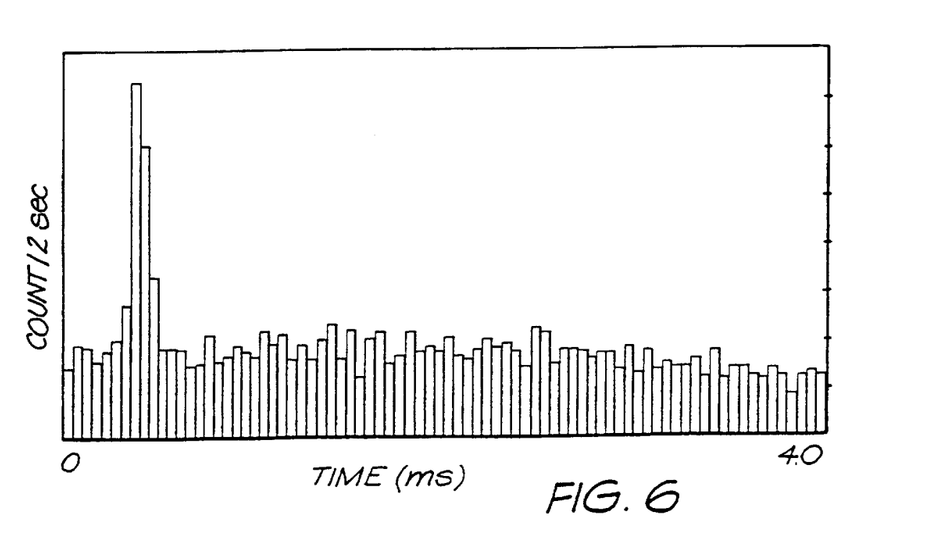
FIG. 6 is a histogram of counts from a plurality of spreads of time delay values generated by the microprocessor means of the present invention.

As is also depicted in FIG. 6, the microprocessor means 51 can be adapted to still activate an alarm even in those instances where no peak time delay value has been determined. For example, different alarm types can be activated simply on detection of high or medium levels of ultrasonic pulses.

By being able to activate different classes of alarm, the microprocessor means 51 can be used as an indicator, not just of the presence of a fault in the transformer's insulation, but also as an indicator of the severity of the fault and the rate of degradation of the transformer. For example, activation of a Class 4 alarm type might not be considered a significant cause of concern but may at least warrant that this transformer be monitored more closely in future. It may also mean that the transformer should undergo routine maintenance sooner than had been anticipated. In contrast, activation of a Class 1 alarm type might be considered a significant cause of concern and justify immediate or relatively quick shutdown of the transformer to allow appropriate on-site testing.

It would be anticipated that at least a Class 2 alarm type and possibly a Class 3 or 4 alarm type would be activated before the activation of a Class 1 alarm type in the case where a fault was gradually occurring in the insulation of a transformer. As such, by monitoring the rate of activation of the alarm types from Class 4 to Class 1 also provides an indication of how quickly the severity of the fault is increasing in the transformer's insulation.

In the depicted embodiment, the alarm that is activated by the microprocessor means 51 comprises a message on a computer monitor 52 that indicates the class of alarm activated by the microprocessor means 51. A corresponding audible alarm can also be activated.

The analysing means 50 can be networked to a central controller 60, such as a PC monitor display and data logger. The PC monitor display and data logger can be located close to or very distant from the transformer 12 being monitored. For example, the analysing means 50 and PC monitor display and data logger 60 can be networked by a telecommunications network, such as a telephone network. In one system, it can be envisaged that analysing means 50 is in continuous communication with the PC monitor display and data logger 60. In another embodiment, a modem connected to the analysing means 50 can be adapted to dial a modem in the PC monitor display and data logger 60 or vice versa and allow transfer of data as appropriate. The dialing of the modem could be done periodically as was considered necessary by the monitoring organisation. While the analysing means 50 would download data to the PC monitor display and data logger 60, it will be appreciated that the PC monitor display and data logger 60 could provide instructions to the analysing means 50. Such instructions could be used to allow on-line adjustments to the settings of the software instructions running on the microprocessor means 51.

While the PC monitor display and data logger 60 is depicted networked to just one analysing means 50, it will be appreciated that it could be networked to a plurality of analysing means 50 mounted to different transformers in many different locations. This allows, for example, a power distribution authority to monitor the performance of the transformers in its network without the necessity of having maintenance personnel attend at the location of each transformer. This is attractive for distant remote locations in country areas.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. An apparatus for detecting partial discharge in on-line high voltage electrical equipment containing a dielectric each partial discharge generating a radio frequency pulse or wave and an ultrasonic pulse or wave, the apparatus comprising:
    at least one transducer means for detecting the ultrasonic pulse or wave generated by the occurrence of a partial discharge and subsequently outputting a signal corresponding to this detection;
    at least one transducer means for detecting the radio frequency pulse or wave generated by the occurrence of a partial discharge and other radio frequency pulses or waves generated within or external to the equipment and subsequently outputting a signal corresponding to this detection; and
    a signal processing and analysing means which receives the signals corresponding to the detection of the radio frequency and ultrasonic pulses or waves and which on receiving a signal corresponding to detection of an ultrasonic pulse or wave is adapted to:
        (a) determine within a pre-set time period preceding the instance of time of detection of the ultrasonic pulse or wave the time delay between the instance of detection of all detected radio frequency pulses or waves and the instance of detection of said ultrasonic pulse or wave and generate a spread of time delay values over the pre-set time period;
        (b) superimpose the spread of time delay values against other spreads of time delay values of a plurality of other detected ultrasonic pulses or waves; and
        (c) analyse the superimposed spreads of time delay values to determine if a proportion of the detected ultrasonic pulses or waves are being detected at one or more particular time delay values after the time of detection of the detected radio frequency pulses or waves.

2. The apparatus of claim 1 wherein the respective transducer means continuously monitor the electrical equipment.

3. The apparatus of claim 1 wherein the pre-set time period preceding the time of detection of the ultrasonic pulse is set to be greater than the maximum possible time delay that could exist between a detected radio frequency pulse and a detected ultrasonic pulse in the electrical equipment.

4. The apparatus of claim 1 wherein the pre-set time period is set between 1 ms and 10 ms, more preferably between 2 ms and 6 ms and still more preferably at or about 4 ms.

5. The apparatus of claim 1 wherein the signal processing software and analysing means superimpose all spreads generated within a particular time period.

6. The apparatus of claim 5 wherein the analysing means superimposes all spreads generated in a particular time period just preceding the step of superimposing the spreads.

7. The apparatus of claim 6 wherein the time period can be between 0.1 and 10 seconds, more preferably 1 and 8 seconds and even more preferably be about 2 seconds.

8. The apparatus of claim 1 wherein the analysing means comprises a microprocessor means under the control of appropriate software instruction.

9. The apparatus of claim 8 wherein the software of the microprocessor is adapted to statistically count the number of determined time delay values within a spread of time delay values and superimpose these counts with the counts made from a plurality of such spreads generated on detection of other ultrasonic pulses within the particular pre-set time period to form a histogram of counts versus time delay value.

10. The apparatus of claim 1 wherein the ultrasonic transducer means on detection of an ultrasonic pulse also outputs a signal representative of the amplitude of the detected ultrasonic pulse.

11. The apparatus of claim 10 wherein the analysing means is adapted to undertake no further analysis of the ultrasonic signal if the amplitude of the ultrasonic pulse that lead to the generation of that signal is below a predetermined amplitude setting.

12. The apparatus of claim 1 wherein the radio frequency transducer means on detection of a radio frequency pulse also outputs a signal representative of the amplitude of the detected radio frequency pulse.

13. The apparatus of claim 12 wherein the analysing means is adapted to disregard signals representative of radio frequency pulse less than a pre-determined amplitude setting.

14. The apparatus of claim 1 wherein the analysing means is adapted to activate varying types of alarm means depending on the nature of the detected ultrasonic pulse.

15. The apparatus of claim 14 wherein the alarm means comprise visual and/or audible means.

16. The apparatus of claim 14 wherein the alarm means is physically located close to the monitored transformer or at some distant location.

17. The apparatus of claim 14 wherein the analysing means includes a data storage means adapted to store all signals received from the respective transducer means, and/or the generated superimpositions of spreads of time delay values.

18. The apparatus of claim 17 wherein the data stored on the data storage means is downloadable to a controlling means at a local or remote location either on request of an operator or automatically.

19. The apparatus of claim 18 wherein if the controlling means receives a signal indicative of activation of an alarm means, it can provide an appropriate indication to personnel responsible for monitoring the performance of the transformer.

20. The apparatus of claim 18 wherein the controlling means is adapted to receive data transferred from a plurality of different analysing means.

21. The apparatus of claim 1 wherein the respective transducer means are housed within a common enclosure that is positionable within a wall of the electrical equipment such that one surface of each transducer means is coincident with the interior surface of the wall.

22. The apparatus of claim 1 wherein the transducer means for detection of ultrasonic pulses comprises a piezoelectric element having a first face and a second face, the piezoelectric element having a thickness resonant frequency between about 50 and about 300 kHz, more preferably 60 to 250 kHz, and most preferably at about 190 kHz.

23. The apparatus of claim 22 wherein the piezoelectric element is a ceramic/polymer composite having a 1–3 geometry, the ceramic being selected from the group comprising poly-crystalline lead titanate, lead zirconate titanate (PZT), lead niobate or barium titanate.

24. The apparatus of claim 1 wherein the transducer means for detection of radio frequency pulses is an antenna selected from the group of a ferrite core aerial, a tuned circuit, or a capacitive metal plate.

25. The apparatus of claim 24 wherein the antenna is a capacitive metal plate having an annular geometry.

26. The apparatus of claim 25 wherein the piezoelectric element is positioned coaxially within the capacitive annular plate.

27. The apparatus of claim 1 wherein the location of a partial discharge source within high voltage electrical equipment is determined by analysis of the signal outputs from at least three transducer heads housed within a wall of the electrical equipment.

28. A process for detecting partial discharge in on-line electrical equipment containing a dielectric, each partial discharge generating a radio frequency pulse or wave and an ultrasonic pulse or wave, the process comprising the steps:

(i) detecting radio frequency pulses or waves generated within the equipment;

(ii) detecting ultrasonic pulses or waves generated within the equipment;

(iii) on detection of an ultrasonic pulse or wave, determining within a pre-set time period preceding the instance of time of detection of the ultrasonic pulse or wave, the time delay between the instance of detection of all detected radio frequency pulses or waves and the instance of detection of said ultrasonic pulse or wave and generate a spread of time delay values over the pre-set time period;

(iv) superimposing the spread of time delay values against other spreads of time delay values of a plurality of other detected ultrasonic pulses or waves; and (v) analysing the superimposed spreads of time delay values to determine if a proportion of the detected ultrasonic pulses or waves are being detected at one or more particular time delay values after the time of detection of the detected radio frequency pulses or waves.

* * * * *